(12) United States Patent
Lee et al.

(10) Patent No.: US 12,627,288 B2
(45) Date of Patent: May 12, 2026

(54) VOLTAGE SELECTOR

(71) Applicant: EMEMORY TECHNOLOGY INC., Hsinchu (TW)

(72) Inventors: Yun-Chung Lee, Hsinchu County (TW); Chih-Chun Chen, Hsinchu County (TW)

(73) Assignee: EMEMORY TECHNOLOGY INC., Hsinchu (TW)

( * ) Notice: Subject to any disclaimer, the term of this patent is extended or adjusted under 35 U.S.C. 154(b) by 46 days.

(21) Appl. No.: 18/989,239

(22) Filed: Dec. 20, 2024

(65) Prior Publication Data

US 2025/0264898 A1 Aug. 21, 2025

Related U.S. Application Data

(60) Provisional application No. 63/554,164, filed on Feb. 16, 2024.

(51) Int. Cl.
*H03K 17/693* (2006.01)
*H03K 17/00* (2006.01)

(52) U.S. Cl.
CPC ......... *H03K 17/005* (2013.01); *H03K 17/693* (2013.01)

(58) Field of Classification Search
None
See application file for complete search history.

(56) References Cited

U.S. PATENT DOCUMENTS

| | | | |
|---|---|---|---|
| 6,359,497 B1 * | 3/2002 | Criscione | H03K 17/693 327/63 |
| 6,847,249 B1 * | 1/2005 | Brokaw | H03K 17/693 327/407 |
| 7,893,566 B2 * | 2/2011 | Yarbrough | H03K 3/356 307/64 |
| 9,337,660 B1 * | 5/2016 | Bourstein | H02J 4/00 |
| 9,977,480 B2 * | 5/2018 | Kolla | G06F 1/263 |
| 10,090,674 B2 * | 10/2018 | Elsayed | H02J 1/10 |
| 10,281,502 B2 * | 5/2019 | Kuo | G01R 19/16519 |
| 10,693,461 B1 | 6/2020 | Chang | |
| 10,790,821 B1 | 9/2020 | Chang et al. | |
| 11,320,850 B1 * | 5/2022 | Myles | H03K 19/20 |
| 2024/0021246 A1 | 1/2024 | Huang et al. | |
| 2024/0062204 A1 | 2/2024 | Parker et al. | |

* cited by examiner

*Primary Examiner* — Thomas J. Hiltunen
(74) *Attorney, Agent, or Firm* — WPAT, P.C.; Anthony King

(57) ABSTRACT

A voltage selector includes a first input terminal for receiving a first input voltage, a second input terminal for receiving a second input voltage, an output terminal, a main select circuit and a reference circuit. The main select circuit includes a select unit for outputting a higher input voltage as an output voltage to the output terminal, and an auxiliary unit for pulling up the output voltage to the first input voltage according to a reference voltage when the first input voltage equals to the second input voltage. The reference circuit pulls up the reference voltage according to a higher one of the first input voltage and the second input voltage, and pulls down the reference voltage when the first input voltage equals to the second input voltage and the output voltage is lower than the first input voltage by a threshold voltage.

20 Claims, 8 Drawing Sheets

VOLTAGE SELECTOR

CROSS REFERENCE

This application claims the benefit of prior-filed U.S. provisional application No. 63/554,164, filed on Feb. 16, 2024, which is incorporated by reference in its entirety.

TECHNICAL FIELD

The present disclosure relates to a voltage selector, and more particularly, to a voltage selector capable with a feedback-controlled scheme.

DISCUSSION OF THE BACKGROUND

As the functions of electronic circuits become more and more complicated, the electronic circuits may require different levels of voltages for performing different operations. For example, a non-volatile memory circuit requires a regular system voltage for reading operation, and requires a higher voltage for programming operation. In such case, a voltage selector can be employed to switch between different voltages according to the operation to be performed.

The voltage selector is designed to receive input voltages from two different input terminals and output the higher one of the two input voltages. However, in prior art, when the two input voltages are at a same level, the output terminal of the voltage selector would become floating, causing the voltage selector trapped in an unstable status with risk of current leakage.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a voltage selector. The voltage selector includes a first input terminal, a second input terminal, an output terminal, a main select circuit, and a reference circuit. The first input terminal receives a first input voltage, and the second input terminal receives a second input voltage. The output terminal outputs an output voltage. The main select circuit includes a select unit and an auxiliary unit. The select unit includes a first transistor coupled between the first input terminal and the output terminal, and a second transistor coupled between the second input terminal and the output terminal. The first transistor is turned on when the first input voltage is higher than the second input voltage, and the second transistor is turned on when the second input voltage is higher than the first input voltage. The auxiliary unit is controlled by a reference voltage to be activated to conduct at least one of a first electrical path between the first input terminal and the output terminal or a second electrical path between the second input terminal and the output terminal to pull up the output voltage when the first input voltage equals to the second input voltage. The reference circuit includes a pull down unit. The pull down unit pulls down the reference voltage when the first input voltage equals to the second input voltage and the output voltage is lower than the first input voltage by a threshold voltage.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

Figure 1:
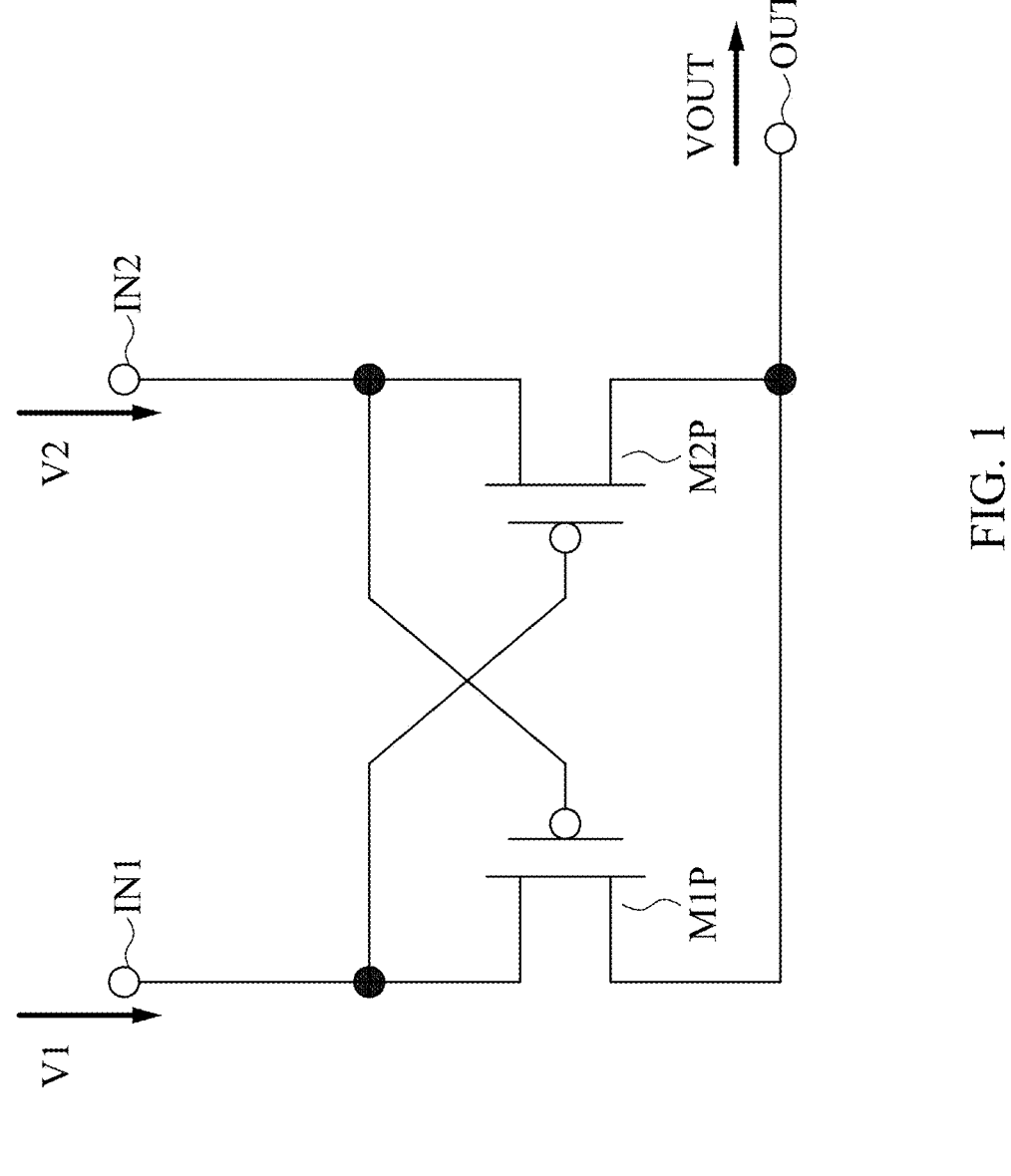
FIG. 1 shows a voltage selector 900 according to one comparative embodiment of the present embodiment.

FIG. 1 shows a voltage selector 900 according to one comparative embodiment of the present embodiment. The voltage 900 includes input terminals IN1 and IN2, P-type transistors M1P and M2P, and an output terminal OUT. The P-type transistor MIP includes a first terminal, a second terminal, and a control terminal. The first terminal of the P-type transistor M1P is coupled to the input terminal IN1 for receiving a first input voltage V1, the second terminal of the P-type transistor MIP is coupled to the output terminal OUT, and a control terminal of the P-type transistor M1P is coupled to the input terminal IN2 for receiving a second input voltage V2. The P-type transistor M2P includes a first terminal, a second terminal, and a control terminal. The first terminal of the P-type transistor M2P is coupled to the input terminal IN2 for receiving the second input voltage V2, the second terminal of the P-type transistor M2P is coupled to the output terminal OUT, and the control terminal of the P-type transistor M2P is coupled to the input terminal IN1 for receiving the first input voltage V1.

When the first input voltage V1 is higher than the second input voltage V2 (e.g., V1 is 5V and V2 is 0V), the P-type transistor M1P is turned on and the P-type transistor M2P is turned off. In such case, the output terminal OUT would output the first input voltage V1 as the output voltage VOUT.

However, when the first input voltage V1 and the second input voltage V2 are at the same level (e.g., V1 and V2 are both 5V), the P-type transistors M1P and M2P would both be turned off and the output terminal OUT would become floating. In such case, the output voltage VOUT would be pulled down by a load current, causing uncertainty to the system that employing the voltage selector 900.

Figure 2:
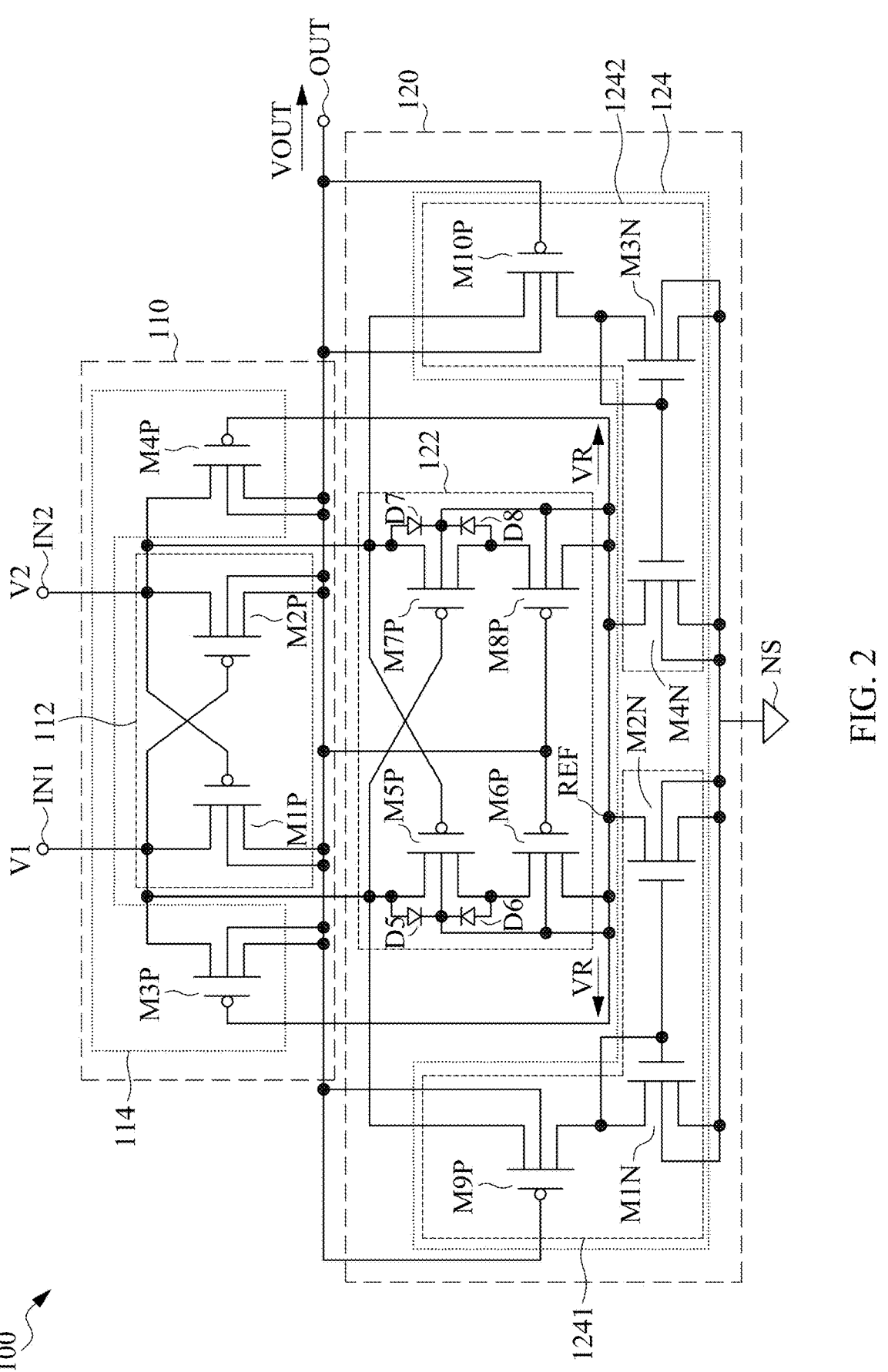
FIG. 2 shows a voltage selector 100 according to one embodiment of the present disclosure.

FIG. 2 shows a voltage selector 100 according to one embodiment of the present disclosure. The voltage selector 100 includes input terminals IN1, IN2, an output terminal OUT1, a main select circuit 110, and a reference circuit 120.

The input terminal IN1 can receive a first input voltage V1, and the input terminal IN2 can receive a second input voltage V2. The main select circuit 110 includes a select unit 112 and an auxiliary unit 114. The select unit 112 can conduct an electrical path between the input terminal IN1 and the output terminal OUT when the first input voltage V1 is higher than the second input voltage V2, and can conduct an electrical path between the second input terminal IN2 and the output terminal OUT when the second input voltage V2 is higher than the first input voltage V1. As a result, the select unit 112 is able to output a higher one of the input voltages V1 and V2.

The auxiliary unit 114 can conduct at least one of an electrical path between the input terminal IN1 and the output terminal OUT or an electrical path between the input terminal IN2 and the output terminal OUT according to a reference voltage VR when the first input voltage V1 substantially equals to the second input voltage V2. That is, when the first input voltage V1 is substantially equal to the second input voltage V2 and the output voltage VOUT is pulled down by the load current, the output terminal OUT can be charged through the electrical path connected to the input terminal IN1 and/or the electrical path connected to the input terminal IN2 conducted by the auxiliary unit 114. As a result, the terminal OUT would not be floating, and the output voltage VOUT can be adjusted to a level close to the first input voltage V1 or the second input voltage V2 even when the first input voltage V1 substantially equals to the second input voltage V2.

The reference circuit 120 can generate the reference voltage VR so that the auxiliary unit 114 can conduct the electrical path connected to the input terminal IN1 and/or the electrical path connected to the input terminal IN2 accordingly. The reference circuit 120 includes a pull up unit 122 and a pull down unit 124. The pull up unit 122 can pull up the reference voltage VR according to a higher one of the first input voltage V1 and the second input voltage V2. The pull down unit 124 can pull down the reference voltage VR when the first input voltage V1 equals to the second input voltage V2. Therefore, the reference voltage VR can be properly controlled in different conditions, thereby ensuring the stability of the voltage selector 100.

Since the voltage selector 100 can maintain the stability of output voltage VOUT either in the situation when one of the first input voltage V1 and the second input voltage V2 is higher than another or in the situation when the input voltage V1 and the second input voltage V2 are substantially equal, the voltage selector 100 can help to reduce the risk of current leakage and improve the safety of the system that employs the voltage selector 100.

As shown in FIG. 2, the select unit 112 may include P-type transistors M1P and M2P. The first P-type transistor M1P includes a first terminal, a second terminal, and a control terminal. The first terminal of the P-type transistor M1P is coupled to the input terminal IN1, the second terminal of the P-type transistor M1P is coupled to the output terminal OUT, and the control terminal of the P-type transistor M1P is coupled to the input terminal IN2. The P-type transistor M2P includes a first terminal, a second terminal, and a control terminal. The first terminal of the P-type transistor M2P is coupled to the input terminal IN2, the second terminal of the P-type transistor M2P is coupled to the output terminal OUT, and the control terminal of the P-type transistor M2P is coupled to the input terminal IN1. In addition, each of the P-type transistors M1P and M2P further includes a body terminal coupled to the output terminal OUT.

The auxiliary unit 114 may include P-type transistors M3P and M4P. The P-type transistor M3P includes a first terminal, a second terminal, and a control terminal. The first terminal of the P-type transistor M3P is coupled to the input terminal IN1, the second terminal of the P-type transistor M3P is coupled to the output terminal OUT, and the control terminal of the P-type transistor M3P can receive the reference voltage VR. The P-type transistor M4P includes a first terminal, a second terminal, and a control terminal. The first terminal of the P-type transistor M4P is coupled to the input terminal IN2, the second terminal of the P-type transistor M4P is coupled to the output terminal OUT, and the control terminal of the P-type transistor M4P can receive the reference voltage VR. In addition, each of the P-type transistors M3P and M4P further includes a body terminal coupled to the output terminal OUT.

The pull up unit 122 may include a reference terminal REF for outputting the reference voltage VR, and P-type transistors M5P, M6P, M7P, and M8P. The P-type transistor M5P includes a first terminal, a second terminal, and a control terminal. The first terminal of the P-type transistor M5P is coupled to the input terminal IN1, and the control terminal of the P-type transistor M5P is coupled to the input terminal IN2. The P-type transistor M6P includes a first terminal, a second, and a control terminal. The first terminal of the P-type transistor M6P is coupled to the second terminal of the P-type transistor M5P, the second terminal of the P-type transistor M6P is coupled to the reference terminal REF, and the control terminal of the P-type transistor M6P is coupled to the output terminal OUT. The P-type transistor M7P includes a first terminal, a second terminal, and a control terminal. The first terminal of the P-type transistor M7P is coupled to the input terminal IN2, the control terminal of the P-type transistor M7P is coupled to the input terminal IN1. The P-type transistor M8P includes a first terminal, a second terminal, and a control terminal. The first terminal of the P-type transistor M8P is coupled to the second terminal of the P-type transistor M7P, the second terminal of the P-type transistor M8P is coupled to the reference terminal REF, and the control terminal of the P-type transistor M8P is coupled to the output terminal OUT. In addition, the P-type transistors M5P, M6P, M7P, and M8P are formed on the same N-well, and well junction diodes D5-D8 are formed between the S/D terminals of the P-type transistors M5P, M6P, M7P, M8P and the N-well, and the well junction diodes D5-D8 can be considered as a single effective diode, and thus each of the P-type transistors M5P, M6P, M7P, and M8P further includes a body terminal coupled to each other, and the body terminals of the P-type transistors M5P, M6P, M7P, and M8P further coupled to the reference terminal REF.

The pull down unit 124 may include two current mirrors 1241 and 1242. The current mirrors 1241 and 1242 can be coupled to the input terminal IN1 and the second terminal IN2 respectively, and can conduct discharging currents to pull down the reference voltage VR according to the output voltage VOUT.

In some embodiments, the current mirror 1241 may include a P-type transistor M9P and N-type transistors M1N and M2N. The P-type transistor M9P includes a first terminal, a second terminal, and a control terminal. The first terminal of the P-type transistor M9P is coupled to the input terminal IN1, and the control terminal of the P-type transistor M9P is coupled to the output terminal OUT. The N-type transistor M1N includes a first terminal, a second terminal, and a control terminal. The first terminal of the N-type transistor M1N is coupled to the second terminal of the P-type transistor M9P, the second terminal of the N-type transistor M1N is coupled to a system terminal NS for receiving a system voltage VS, and the control terminal of the N-type transistor M1N is coupled to the first terminal of the N-type transistor M1N. In some embodiments, the system terminal NS can be a ground terminal, and the system voltage can be the ground voltage. The N-type transistor M2N includes a first terminal, a second terminal, and a control terminal. The first terminal of the N-type transistor M2N is coupled to the reference terminal REF, the second terminal of the N-type transistor M2N is coupled to the system terminal NS, and the control terminal of the N-type transistor M2N is coupled to the control terminal of the N-type transistor M1N. In addition, the P-type transistor M9P further includes a body terminal coupled to the output terminal OUT, and each of the N-type transistors M1N and M2N further includes a body terminal coupled to the system terminal NS.

Furthermore, the current mirror 1242 may include a P-type transistor M10P, and N-type transistors M3N and M4N. The P-type transistor M10P includes a first terminal, a second terminal, and a control terminal. The first terminal of the P-type transistor M10P is coupled to the input terminal IN2, and the control terminal of the P-type transistor M10P is coupled to the output terminal OUT. The N-type transistor M3N includes a first terminal, a second terminal, and a control terminal. The first terminal of the N-type transistor M3N is coupled to the second terminal of the P-type transistor M10P, the second terminal of the N-type transistor M3N is coupled to the system terminal NS, and the control terminal of the N-type transistor M3N is coupled to the first terminal of the N-type transistor M3N. The N-type transistor M4N includes a first terminal, a second terminal, and a control terminal. The first terminal of the N-type transistor M4N is coupled to the reference terminal REF, the second terminal of the N-type transistor M4N is coupled to the system terminal NS, and the control terminal of the N-type transistor M4N is coupled to the control terminal of the N-type transistor M3N. In addition, the P-type transistor M10P further includes a body terminal coupled to the output terminal OUT, and each of the N-type transistors M3N and M4N further includes a body terminal coupled to the system terminal NS.

Figure 3:
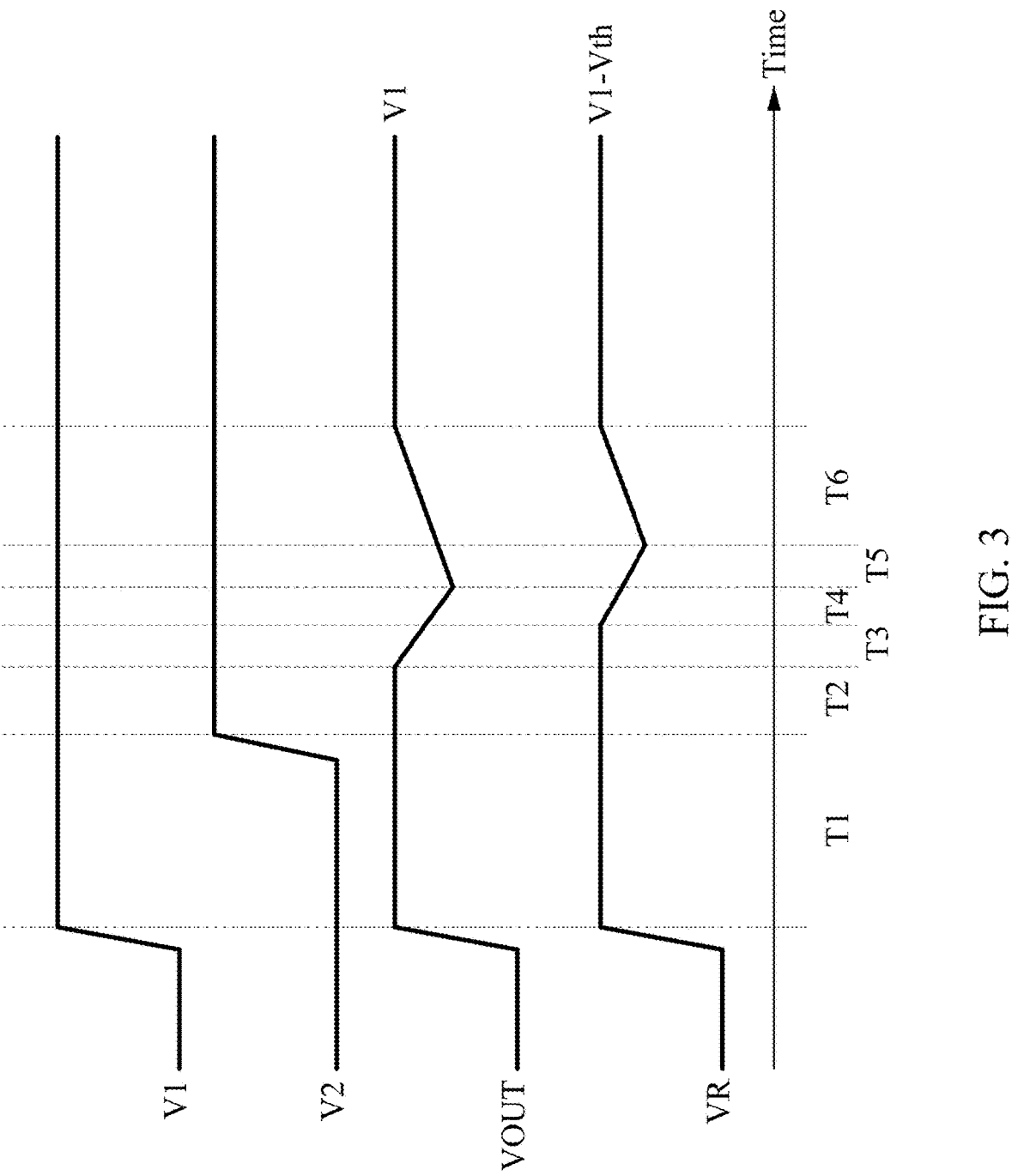
FIG. 3 shows a timing diagram of voltages at the input terminals, output terminal, and the reference terminal of the voltage selector in FIG. 1 according to one embodiment of the present disclosure.

FIG. 3 shows a timing diagram of voltages at the input terminals IN1, IN2, output terminal OUT, and the reference terminal REF according to one embodiment of the present disclosure. FIGS. 4 to 8 show the charging and discharging behavior of the voltage selector 100 in different periods of FIG. 3 according to one embodiment of the present disclosure.

Figure 4:
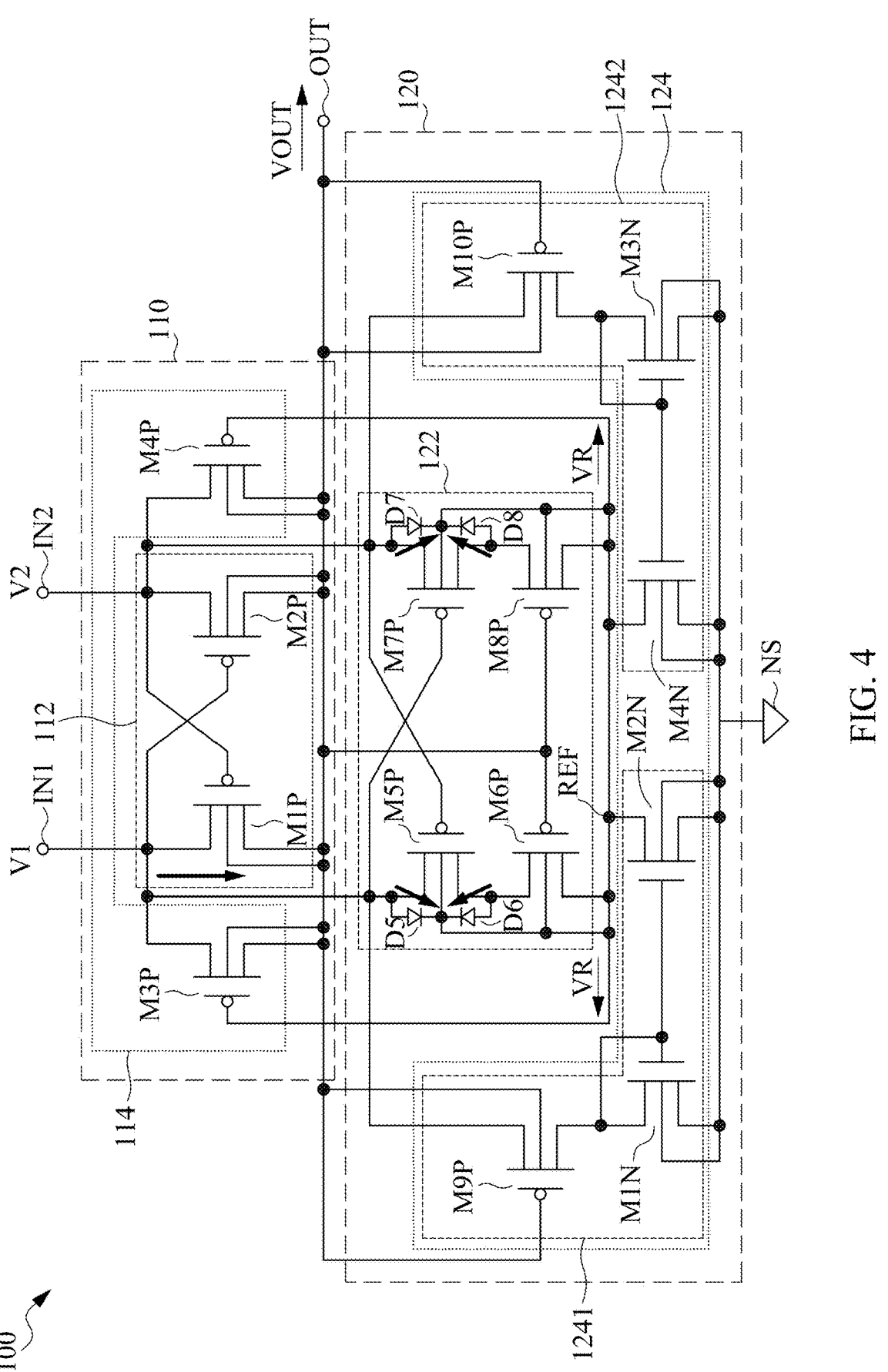
FIGS. 4 to 8 show the charging and discharging behavior of the voltage selector in different periods according to one embodiment of the present disclosure.

During the period T1 shown in FIG. 3, the first input voltage V1 becomes higher than the second input voltage V2. For example, the first input voltage V1 may be 5V and the second input voltage V2 may be 0V. In such case, as shown in FIG. 4, the P-type transistor M1P is turned on, thereby conducting an electrical path between the input terminal IN1 and the output terminal OUT. As a result, the current conducted by the P-type transistor M1P can charge the output terminal OUT, thereby pulling up the output voltage VOUT to be substantially the same level as the first input voltage V1 (e.g., 5V).

In addition, during the period T1, as the output voltage VOUT is pulled up to the first input voltage V1, the P-type transistors M2P, M6P, M7P, M8P, M9P, and M10P are turned off, and the reference terminal REF may be charged through the well junction diodes D5-D8 of the P-type transistor M5P, M6P, M7P, and M8P. The reference voltage VR can be pulled up to a level that is less than the first input voltage V1 by a threshold voltage Vth of the effective diode formed by the well junction diodes D5-D8. In some embodiments, if the threshold voltage Vth of the effective diode is 0.6V, then the reference voltage VR would be at 4.4V in the period T1.

Figure 5:
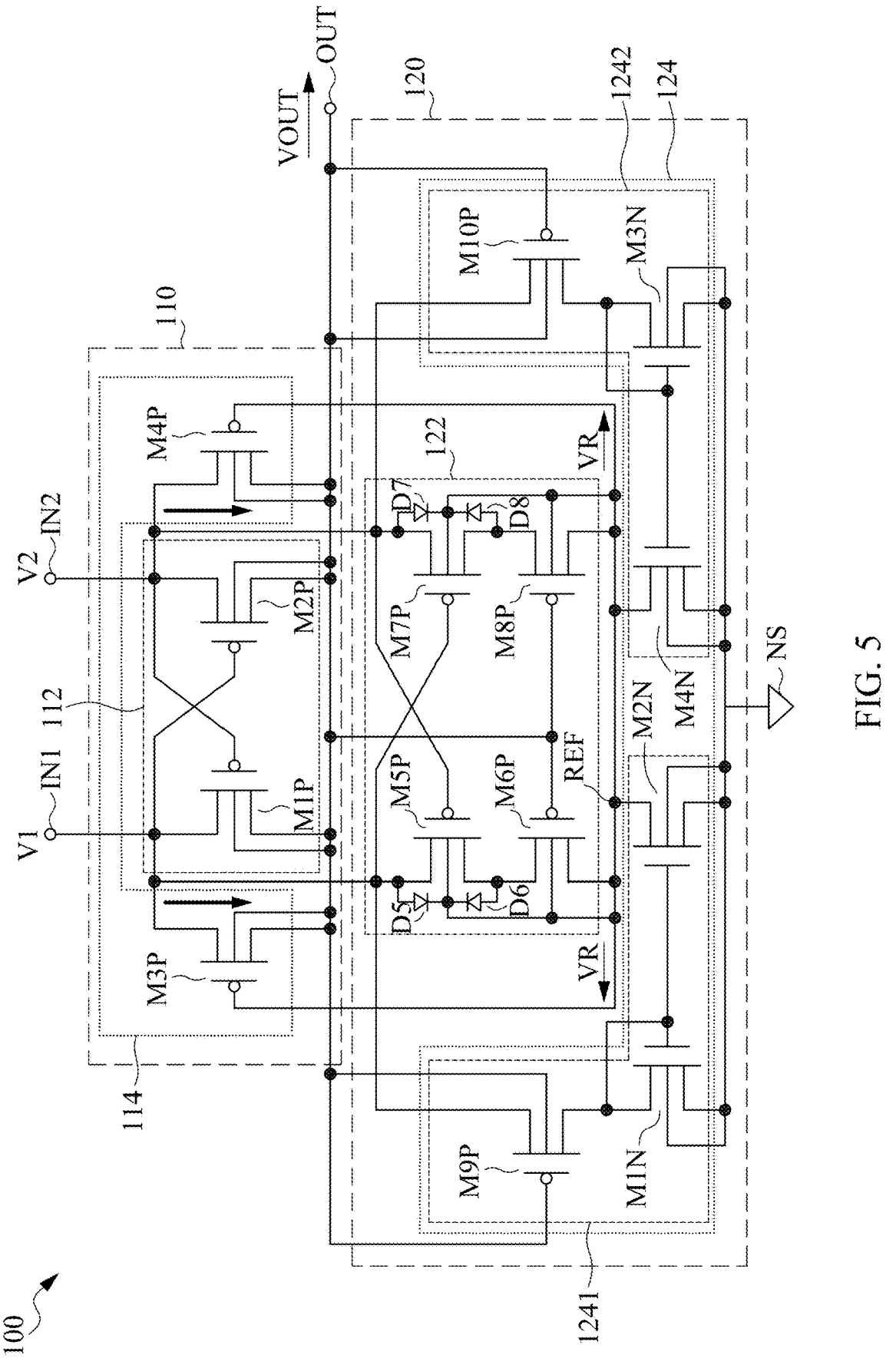

During the period T2, the second input voltage V2 is also raised to the same level as the first input voltage V1, for example 5V. In such case, the P-type transistors M1P, M2P, M5P, M6P, M7P, M8P, M9P, and M10P are turned off, and the P-type transistors M3P and M4P may be weakly turned on depending on the level of the reference voltage VR as shown in FIG. 5. In such case, if the load coupled to the output terminal OUT does not draw a significant current, the output voltage VOUT may basically remain at the same level as it was in the period T1 (e.g., 5V).

During the beginning of the period T3, transistors M1P, M2P, M5P, M6P, M7P, M8P, M9P, and M10P are turned off, and the output voltage VOUT is dropped because, for example, the load current increases. As the load current continues to discharge the output terminal OUT, the output voltage VOUT may keep decreasing. However, when the output voltage VOUT is lower than the first input voltage V1 by the threshold voltage of the P-type transistors M9P and M10P as shown in the period T4, the P-type transistors M9P and M10P will be turned on. In some embodiments, the P-type transistors M1P to M10P may have the same threshold voltage of 0.6V. Therefore, the P-type transistors M9P and M10P will be turned on when the output voltage VOUT is lowered to 4.4V. However, the present disclosure is not limited thereto.

Figure 6:
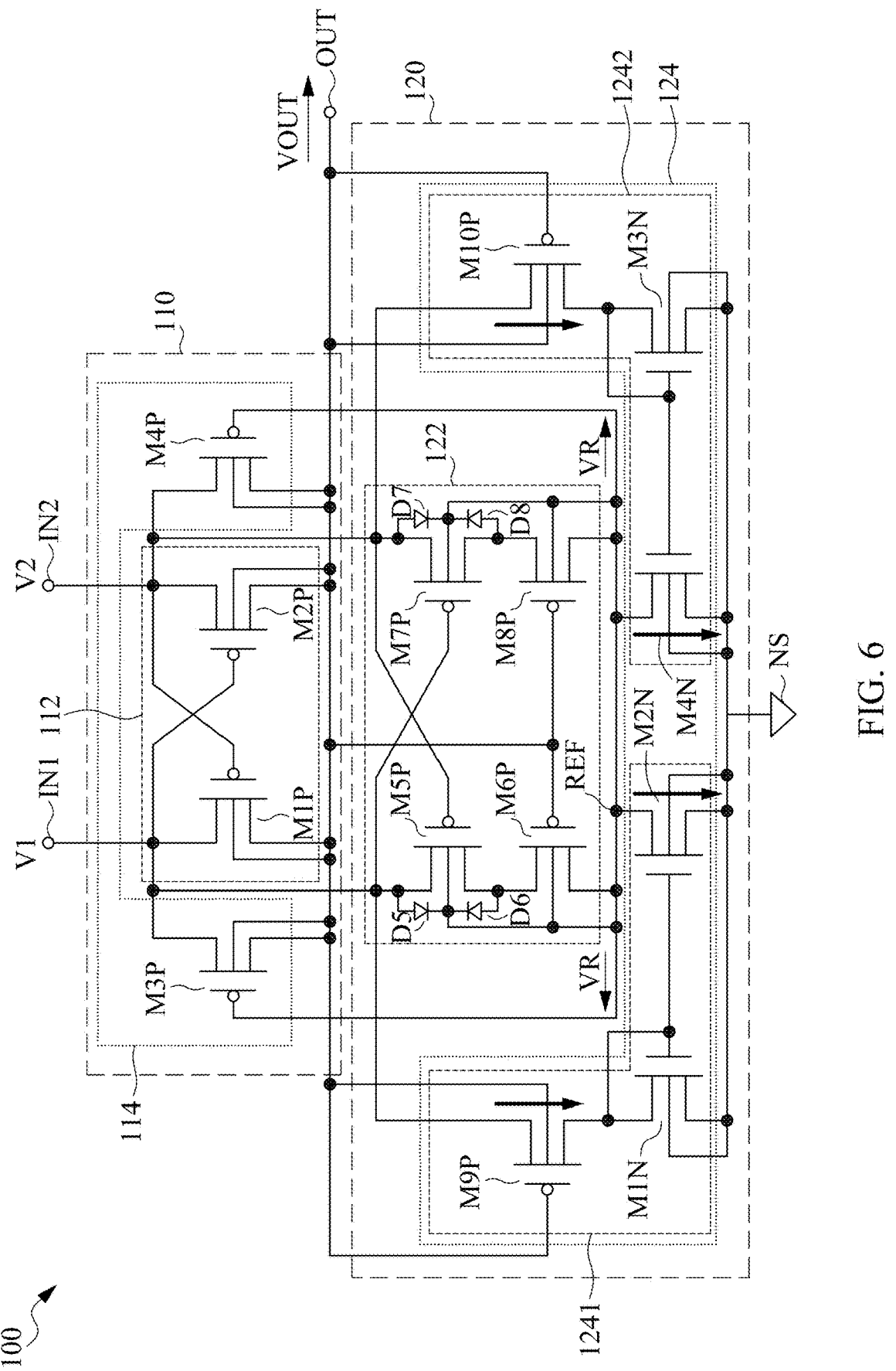

During the period T4, as shown in FIG. 6, the P-type transistors M9P and M10P are turned on so the current mirrors 1241 and 1242 are activated. In such case, the N-type transistors M1N to M4N will also be turned on, and the reference voltage VR would be pulled down by currents conducted by the N-type transistors M2N and M4N.

Figure 7:
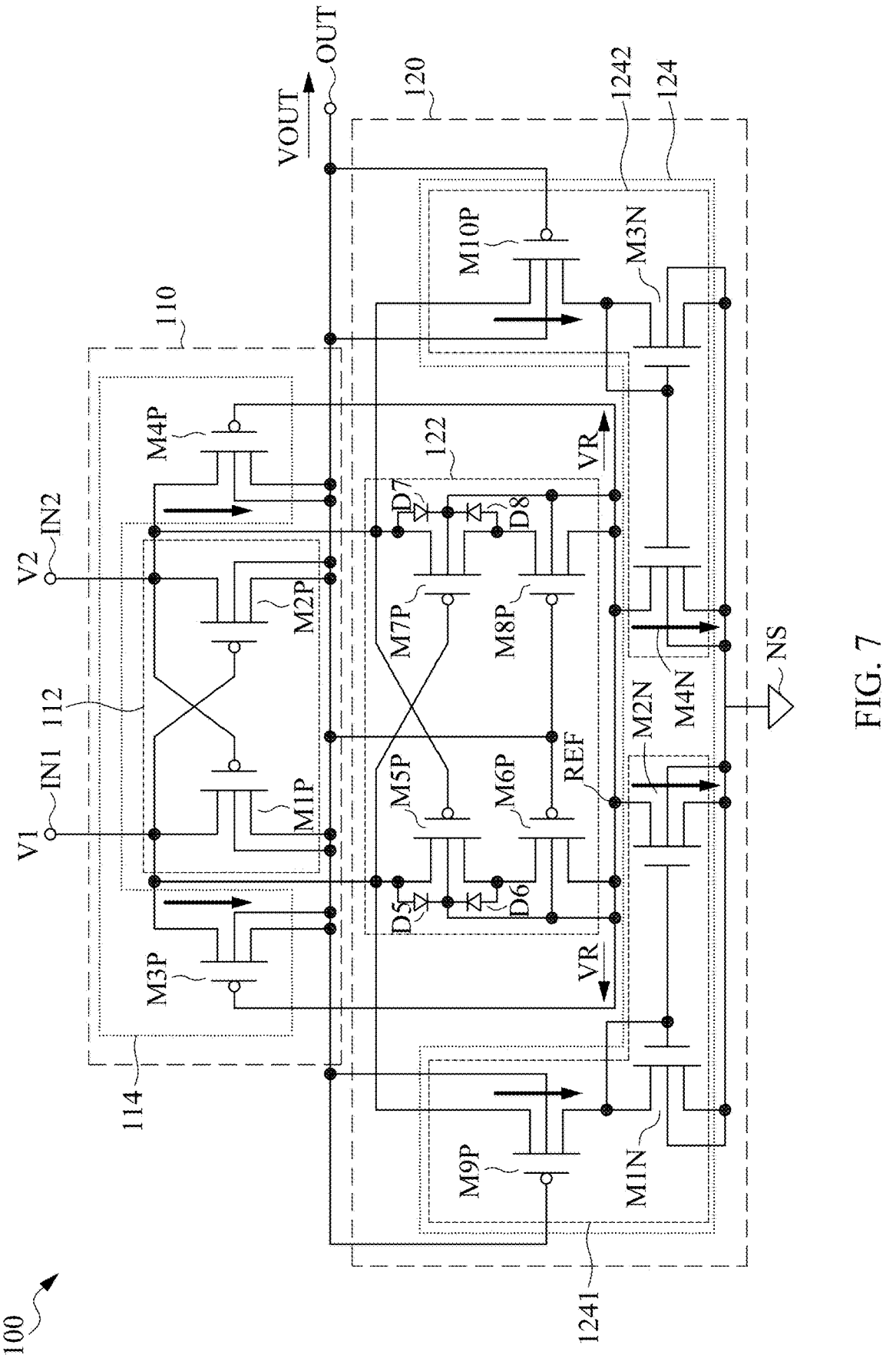

During the period T5 following the period T4, as the reference voltage VR is pulled down, the P-type transistor M3P and the P-type transistor M4P are turned on, so that the output terminal OUT can be charged as shown in FIG. 7. As a result, the output voltage VOUT can be pulled up. That is, when the output voltage VOUT is lowered to a certain level, the current mirrors 1241 and 1242 in the pull down unit 124 will be activated, thereby pulling down the reference voltage VR to a certain level and turning on the P-type transistors M3P and M4P in the auxiliary unit 114. As a result, the output voltage VOUT can be pulled up again. In some embodiments, the current mirrors 1241 and 1242 may be seen as a duplicated pair circuits that can be activated at the same time to both pulling down the reference voltage VR. In such case, one of the current mirrors 1241 and 1242 may be omitted if the pull-down capability is enough. However, with the two current mirrors 1241 and 1242 that are coupled to the different input terminals IN1 and IN2, it can help to enhance the stability by activating at least one of the current mirrors 1241 and 1242 correspondingly when the first input voltage V1 is not exactly same as the second input voltage.

Figure 8:
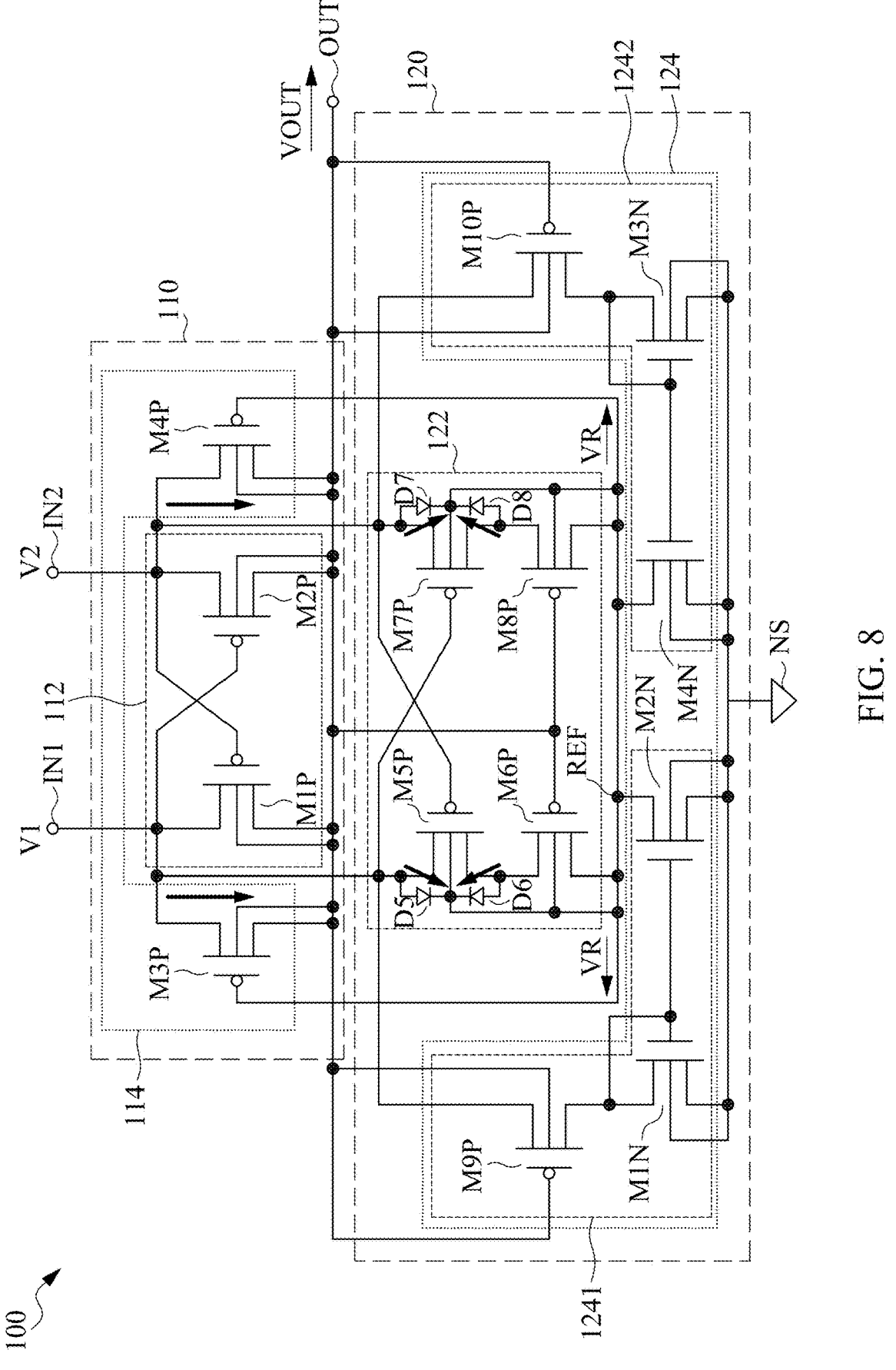

Subsequently, during the period T6 following the period T5, as the output voltage VOUT is gradually pulled up to a level close to the first input voltage V1 or the second input voltage V2, the P-type transistors M9P and M10P will finally be turned off and the current mirrors 1241 and 1242 will be deactivated. In addition, as shown in FIG. 8, the well junction diodes D5-D8 of the P-type transistors M5P, M7P, M6P and M8P can help to pull up the reference voltage VR so that the reference voltage VR will return to the previous level which the reference voltage VR were at during the period T1.

In some embodiments, the lower the output voltage VOUT is pulled down during the period T3 and T4, the stronger the currents will be conducted by the current mirrors 1241 and 1242. In such case, the reference voltage VR will be pulled down to a lower level, thereby enhancing the driving capability of the P-type transistors M3P and M4P in the auxiliary unit 114. Consequently, the output voltage VOUT can be compensated sooner owing to the feedback-controlled scheme provided by the voltage selector 100.

As shown in the timing diagram of FIG. 3, when the first input voltage V1 is equal to the second input voltage V2 and the output voltage VOUT is lowered due to the increase of the load current, the voltage selector 100 is able to adjust the output voltage VOUT back to a level close to the first input voltage V1 or the second input voltage V2, thereby preventing the risk of current leakage caused by leaving the voltage terminal REF floating. In addition, since the reference voltage VR that controls the auxiliary unit 114 can be controlled by both the pull up driving capability provided by the pull up unit 122 and a pull down driving capability provided by the pull down unit 124, the reference voltage VR can be protected from the risk of being coupled by noises, Therefore, the voltage selector 100 can achieve great stability.

In some embodiments, to minimize the DC current conducted by the P-type transistors M3P and M4P when one of the first input voltage V1 and the second input voltage V2 is higher than another, the P-type transistors M3P and M4P can be chosen to have smaller sizes. For example, the width-to-length ratios of the P-type transistors M1P and M2 P can be greater than the width-to-length ratios of the P-type transistors M3P and M4P.

In addition, as the P-type transistors M5P to M8P are required to charge the reference terminal REF through the well junction diodes D5-D8, the P-type transistors M5P to M8P may be designated to have junctions of greater area. For example, the junction areas of the P-type transistors M5P to M8P can be greater than the junction areas of the N-type transistors M2N and M4N.

Furthermore, to ensure that the reference voltage VR can be pulled down when the current mirrors 1241 and 1242 are activated, the driving capability of the N-type transistors M2N and M4N should have greater than the junction charging capability of the P-type transistors M5P to M8P. For example, the width-to-length ratios of the P-type transistor M5P to M8P can be smaller than the width-to-length ratios of the N-type transistors M2N and M4N. Also, as the current ratios of the current mirrors 1241 and 1242 can be arranged with the sizes of the transistors, the width-to-length ratios of the N-type transistors M2N and M4N can be greater than width-to-length ratios of the N-type transistors M1N and M3N so as to minimize the DC current conducted by the N-type transistors M1N and M3N.

In summary, the voltage selector provided by the embodiments of the present disclosure can control the output voltage at different situations with a feedback-control scheme so as to prevent the risk of current leakage caused by leaving the voltage terminal floating. In addition, since the voltage selector includes a pull down unit and a pull up unit for controlling the reference voltage that is used for triggering the compensation of the output voltage can also be protected from the risk of being coupled by noises, Therefore, the voltage selector provided by the embodiments of the present disclosure can achieve great stability.

What is claimed is:

1. A voltage selector comprising:

a first input terminal configured to receive a first input voltage;

a second input terminal configured to receive a second input voltage;

an output terminal configured to output an output voltage;

a main select circuit comprising:

a select unit comprising a first transistor coupled between the first input terminal and the output terminal, and a second transistor coupled between the second input terminal and the output terminal, wherein the first transistor is configured to be turned on when the first input voltage is higher than the second input voltage, and the second transistor is configured to be turned on when the second input voltage is higher than the first input voltage; and an auxiliary unit configured to be controlled by a reference voltage to be activated to conduct at least one of a first electrical path between the first input terminal and the output terminal or a second electrical path between the second input terminal and the output terminal to pull up the output voltage when the first input voltage equals to the second input voltage; and a reference circuit comprising:

a pull down unit configured to pull down the reference voltage to activate the auxiliary unit to conduct the first electrical path or the second electrical path when the first input voltage equals to the second input voltage and the output voltage is lower than the first input voltage by a threshold voltage.

2. The voltage selector of claim 1, wherein:

a first transistor comprises a first terminal coupled to the first input terminal, a second terminal coupled to the output terminal, and a control terminal coupled to the second input terminal;

a second transistor comprises a first terminal coupled to the second input terminal, a second terminal coupled to the output terminal, and a control terminal coupled to the first input terminal; and the first transistor and the second transistor are P-type transistors.

3. The voltage selector of claim 2, wherein the auxiliary unit comprises:

a third P-type transistor comprising a first terminal coupled to the first input terminal, a second terminal coupled to the output terminal, and a control terminal configured to receive the reference voltage; and a fourth P-type transistor comprising a first terminal coupled to the second input terminal, a second terminal coupled to the output terminal, and a control terminal configured to receive the reference voltage.

4. The voltage selector of claim 3, wherein body terminals of the first transistor, the second transistor, the third P-type transistor, and the fourth P-type transistor are coupled to the output terminal.

5. The voltage selector of claim 3, wherein the reference circuit further comprises a pull up unit configured to pull up the reference voltage according to a higher one of the first input voltage and the second input voltage.

6. The voltage selector of claim 5, wherein the pull up unit comprises:

a reference terminal configured to output the reference voltage;

a fifth P-type transistor comprising a first terminal coupled to the first input terminal, a second terminal, and a control terminal coupled to the second input terminal;

a sixth P-type transistor comprising a first terminal coupled to the second terminal of the fifth P-type transistor, a second terminal coupled to the reference terminal, and a control terminal coupled to the output terminal;

a seventh P-type transistor comprising a first terminal coupled to the second input terminal, a second terminal, and a control terminal coupled to the first input terminal; and an eighth P-type transistor comprising a first terminal coupled to the second terminal of the seventh P-type transistor, a second terminal coupled to the reference terminal, and a control terminal coupled to the output terminal.

7. The voltage selector of claim 6, wherein body terminals of the fifth P-type transistor, the sixth P-type transistor, the seventh P-type transistor, and the eighth P-type transistor are coupled to the reference terminal.

8. The voltage selector of claim 6, wherein the pull down unit comprises a first current mirror coupled between the first input terminal and a system terminal and configured to be controlled by the output voltage to be activated to conduct a discharging current to pull down the reference voltage.

9. The voltage selector of claim 8, wherein the first current mirror comprises:

a ninth P-type transistor comprising a first terminal coupled to the first input terminal, a second terminal, and a control terminal coupled to the output terminal;

a first N-type transistor comprising a first terminal coupled to the second terminal of the ninth P-type transistor, a second terminal coupled to a system terminal, and a control terminal coupled to the first terminal of the first N-type transistor; and a second N-type transistor comprising a first terminal coupled to the reference terminal, a second terminal coupled to the system terminal, and a control terminal coupled to the control terminal of the first N-type transistor.

10. The voltage selector of claim 9, wherein the pull down unit further comprises a second current mirror comprising:

a tenth P-type transistor comprising a first terminal coupled to the second input terminal, a second terminal, and a control terminal coupled to the output terminal;

a third N-type transistor comprising a first terminal coupled to the second terminal of the tenth P-type transistor, a second terminal coupled to the system terminal, and a control terminal coupled to the first terminal of the third N-type transistor; and a fourth N-type transistor comprising a first terminal coupled to the reference terminal, a second terminal coupled to the system terminal, and a control terminal coupled to the control terminal of the third N-type transistor.

11. The voltage selector of claim 10, wherein body terminals of the ninth P-type transistor and the tenth P-type transistor are coupled to the output terminal, and body terminals of the first N-type transistor, the second N-type transistor, the third N-type transistor, and the fourth N-type transistor are coupled to the system terminal.

12. The voltage selector of claim 10, wherein during a first period when the first input voltage equals to the second input voltage, and the output voltage is lower than the first input voltage by the threshold voltage:

the ninth P-type transistor and the tenth P-type transistor are turned on so the first current mirror and the second current mirror are activated, and the reference voltage is pulled down by currents conducted through the second N-type transistor and the fourth N-type transistor.

13. The voltage selector of claim 12, wherein during a second period following the first period:

as the reference voltage is pulled down, the third P-type transistor and the fourth P-type transistor are turned on so as to pull up the output voltage to one of the first input voltage and the second input voltage.

14. The voltage selector of claim 13, wherein during a third period following the second period:

as the output voltage is pulled up, the ninth P-type transistor and the tenth P-type transistor are turned off so the first current mirror and the second current mirror are deactivated, and well junctions diodes of the fifth P-type transistor and the seventh P-type transistor pull up the reference voltage.

15. The voltage selector of claim 10, wherein during a period when the first input voltage is higher than the second input voltage:

the first transistor is turned on so as to pull up the output voltage to the first input voltage, and the second transistor, the third P-type transistor, the fourth P-type transistor, the sixth P-type transistor, the seventh P-type transistor, the eighth P-type transistor, the ninth P-type transistor, and the tenth P-type transistor are turned off.

16. The voltage selector of claim 10, wherein a driving capability of the first transistor is greater than a driving capability of the third P-type transistor.

17. The voltage selector of claim 10, wherein a width-to-length ratio of the first transistor is greater than a width-to-length ratio of the third P-type transistor.

18. The voltage selector of claim 10, wherein junction areas of well junction diodes of the fifth P-type transistor, the sixth P-type transistor, the seventh P-type transistor, and the eighth P-type transistor are greater than that of the second N-type transistor and the fourth N-type transistor.

19. The voltage selector of claim 18, wherein width-to-length ratios of the fifth P-type transistor, the sixth P-type transistor, the seventh P-type transistor, and the eighth P-type transistor are smaller than width-to-length ratios of the second N-type transistor and the fourth N-type transistor.

20. The voltage selector of claim 10, wherein width-to-length ratios of the second N-type transistor and the fourth N-type transistor are greater than width-to-length ratios of the first N-type transistor and the third N-type transistor.

* * * * *